United States Patent [19]

McAllister et al.

[11] Patent Number: 5,523,619

[45] Date of Patent: Jun. 4, 1996

[54] HIGH DENSITY MEMORY STRUCTURE

[75] Inventors: Michael F. McAllister, Clintondale; James A. McDonald, Newburgh; Gordon J. Robbins; Madhavan Swaminathan, both of Wappingers Falls; Gregory M. Wilkins, Poughkeepsie, all of N.Y.

[73] Assignee: International Business Machines Corporation, Armonk, N.Y.

[21] Appl. No.: 146,845

[22] Filed: Nov. 3, 1993

[51] Int. Cl.$^6$ ............................. H01L 23/02; H01L 23/34
[52] U.S. Cl. .......................... 257/686; 257/676; 257/725; 257/777; 257/469
[58] Field of Search .................................. 257/676, 725, 257/777, 786, 723, 686, 469, 470; 361/729, 734, 735, 738, 737, 784, 788, 790; 365/51, 52, 63, 72, 211, 212

[56] References Cited

U.S. PATENT DOCUMENTS

| | | | |
|---|---|---|---|
| 3,832,575 | 8/1974 | Dasgupta et al. | 307/208 |
| 4,074,342 | 2/1978 | Honn et al. | 257/717 |
| 4,365,284 | 12/1982 | Tanaka | 361/738 |
| 4,525,921 | 7/1985 | Carson et al. | 257/725 |
| 4,553,050 | 11/1985 | Feinberg et al. | 257/664 |
| 4,646,128 | 2/1987 | Carson et al. | 257/777 |
| 4,706,166 | 11/1987 | Go | 257/723 |
| 4,714,981 | 12/1987 | Gordon | 361/738 |
| 4,841,170 | 6/1989 | Eccleston | 257/469 |
| 4,879,631 | 11/1989 | Johnson et al. | 361/734 |
| 5,104,820 | 4/1992 | Go et al. | 437/51 |
| 5,138,437 | 8/1992 | Kumamoto et al. | 257/606 |

FOREIGN PATENT DOCUMENTS

91/00683  1/1991  WIPO .

OTHER PUBLICATIONS

Garth, "Memory System—An Ultimate in Packaging Technology", Electro 78 Conference, May 1978, pp. 1–2.

Bhatia et al., "Multilayer Glass Ceramic Substrate Design For SS-1 Supercomputer", 43rd Electronic Components and Technology Conference, Jun. 1993, pp. 935–940.

Primary Examiner—Sara W. Crane
Assistant Examiner—Alice W. Tang
Attorney, Agent, or Firm—Lynn L. Augspurger; Peter Visserman

[57] ABSTRACT

A memory cube comprising a plurality of memory chips, each having a plurality of data storage devices, is provided with an auxiliary chip having inactive line termination circuits and the auxiliary chip or chips are formed as part of the memory cube structure and disposed among the memory chips on an interleave basis. The auxiliary circuit chips are provided with external terminals connected to memory input leads, control leads and data write leads, in close proximity to the termination point of the leads. A decoupling capacitor, integrated in the auxiliary circuit chip, is connected to the power bus in the memory cube structure and eliminates extraneous noise problems occurring with discrete capacitors external to the cube. A heating resistor is provided on the auxiliary circuit chip to maintain the cube structure at a near constant temperature. Temperature sensing diodes are incorporated in the auxiliary chip to provide an accurate mechanism for sensing the temperature internal to the cube.

15 Claims, 2 Drawing Sheets

HIGH DENSITY MEMORY STRUCTURE

BACKGROUND OF THE INVENTION

The invention relates to memory devices for high performance computers and more specifically to high density structures constructed of a plurality of discrete integrated circuit chips, such as integrated circuit memory chips, stacked in a three dimensional fashion.

High density integrated circuit memory chips are known which include a stack of on the order of four to forty semiconductor memory chips. The memory chips are typically of a substantially square configuration and are joined together by an appropriate adhesive in a stacked configuration to form a parallelepiped structure referred to as a memory cube. Each memory chip typically has surface contact metalization on at least one side to provide for connections to the chip. The memory chips are arranged in the cube to allow for interconnections along one or more of the faces of the resulting memory cube. The cube is typically mounted on a printed circuit substrate to provide for external connections to the memory, as depicted in the prior art arrangement shown in FIG. 1.

Stacked integrated circuit packaging structures have been shown to be particularly advantageous for high performance computers. They provide high packaging densities and easier access for interconnections. They are simplified manufacturing processes at reduced costs, while providing improved structural strength.

The high-speed memory arrays typically consist of CMOS VLSI chips having large numbers of gates on each chip. A problem with densely packed, high-speed memory devices is the signal interference or "noise" which occurs when the memory is accessed to read data from or write data into the individual memory arrays. Particularly, every time one of the many gates of the chip is switched, as in response to a memory select signal, it tends to produce a current spike on the power bus and the cumulative effect is to cause troublesome transient spikes on the power supply bus which may affect circuit operation. Similarly, simultaneous switching of output drivers during memory read operations causes power supply transients due to the series inductance of the packaging structure. Furthermore, ringing or transmission line noise due to lack of proper terminating circuits at the memory cube causes performance loss for the signal transmitting driver circuits. These noise problems are generally understood and can be solved by providing additional noise limiting circuit elements such as decoupling capacitors and line termination networks. A significant problem in memory design, particularly in the design of high density memory structures such as the memory cube, is the packaging of additional circuit elements which are needed to build a memory which can be accessed at the high rates required for high speed operation.

Additional circuit elements which are typically required in high performance memories include temperature sensing diodes. To assure that the memory chips will operate properly at elevated temperatures, they are tested at high temperatures in what is referred to as a burn-in test. It is difficult to accurately determine the temperature of memory devices under test without internal temperature sensory devices. Since temperature sensing is not required at all chips, the temperature sensing devices are typically not included in the memory chips to keep down the costs of the chips and no inexpensive and accurate means of measuring internal cube temperature is available.

The memory cubes comprise a plurality of silicon integrated circuit chips. For protection of the chip and to provide proper insulation, the silicon chips typically are encapsulated with a passivation layer. They are bonded together by an adhesive applied to the passivation layer. A problem with such a structure is a tendency to crack with large temperature changes due to the difference in coefficient of expansion of the silicon and the passivation and adhesive materials. It is therefore desirable to maintain the structure within a preferred temperature range.

In one known configuration, a memory cube is mounted on a carrier which, in turn, is mounted on a substrate. The basic function of the carrier is to provide connection to discrete decoupling capacitors and terminating networks provided to reduce noise spikes. A problem with that configuration, however, is the added expense and space requirements of a separate carrier. Because of the ever increasing demand for a larger capacity, cheaper memories, both space and manufacturing process expense are criteria which drive to design of memory devices. A major concern in the design of the memory device is to provide effective noise reducing circuitry at a physical location in close proximity to the memory devices. For example, discrete capacitors even a relatively small distance removed from the semiconductor devices become ineffective at high data repetition rates, such as data rates in the 50 to 100 megahertz range occurring during data transfers, particularly for high-band width, large data word memories. Similarly, line terminating networks removed a significant distance from the line terminating point become ineffective. It is therefore desirable to provide decoupling capacitors and line termination devices in close proximity to the integrated circuit devices.

SUMMARY OF THE INVENTION

These and other problems of the prior art are overcome in accordance with the present invention by means of an especially designed auxiliary integrated circuit chip which is provided with noise reducing circuitry and which is incorporated in the integrated circuit cube structure. Advantageously, the auxiliary chip and its noise reducing circuit elements are in very close proximity to the sources of the noise and are therefore in a most effective position. Furthermore, the auxiliary integrated circuit chips may be produced with standard integrated circuit techniques at low cost and incorporated in the cube structure in the same fashion as a memory chip. Advantageously, the need for a separate carrier for connection to noise reducing, and its associated cost and space requirements, is eliminated.

In an integrated circuit structure in accordance with the principles of this invention, an auxiliary circuit chip incorporating a plurality of line termination circuits has substantially the same physical dimensions as a number of discrete integrated circuit chips and joined together with the other integrated circuit chips to form a memory structure substantially having the shape of a parallelepiped and terminals of the discrete integrated circuit chips are connected to line termination circuits in the auxiliary circuit chip.

In accordance with one aspect of the invention, the integrated circuit structure includes a power bus and the auxiliary circuit chip comprises a decoupling capacitor connected to the power bus. Advantageously, the decoupler capacitor is connected to the power bus in close proximity to the source of noise spikes without introducing interconnect inductance and further undesirable noise signals.

In accordance with a particular embodiment of the invention, the auxiliary circuit chip further comprises a heating resistor for maintaining the integrated circuit structure at a near uniform temperature.

In accordance with another aspect of the invention, the auxiliary circuit chip comprises a temperature sensing diode for sensing temperature internal to the structure.

In one particular embodiment of the invention, a plurality of the discrete integrated circuit chips comprise data storage devices and an auxiliary chip is selectively connected to memory address terminals, read/write control terminals, and memory data write terminals. Advantageously, an auxiliary circuit chip may be connected to a plurality of memory chips and several auxiliary circuit chips may be disposed among a plurality of memory chips on an interleaved basis.

BRIEF DESCRIPTION OF THE DRAWING

An illustrative embodiment of the invention is described below with reference to the drawing in which.

DETAILED DESCRIPTION

Figure 1:
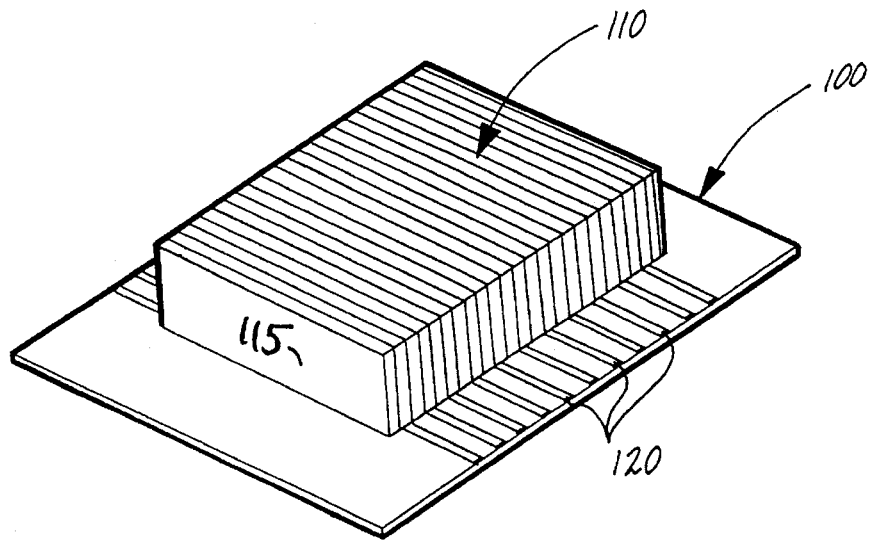
FIG. 1 is a representation of a prior art memory cube mounted on a substrate.

FIG. 1 is a perspective view of a prior art integrated circuit memory package including a printed circuit substrate 100 on which is mounted a memory cube 110 consisting of a plurality of integrated circuit memory chips 115, each comprising a multiple integrated circuit memory devices. The chips are bonded together by a means of an appropriate adhesive. The memory cube is provided with metalized connections on the underside of the memory cube structure, which are electrically connected to printed circuit conductors 120 on the substrate 100. By means of the substrate 100 connections are made to external circuitry such as power supply conductors and memory control, and data lines. Interconnections between the memory chips 115 may be made along the top or vertical sides of the memory cube 110, as well as along its bottom side.

Figure 2:
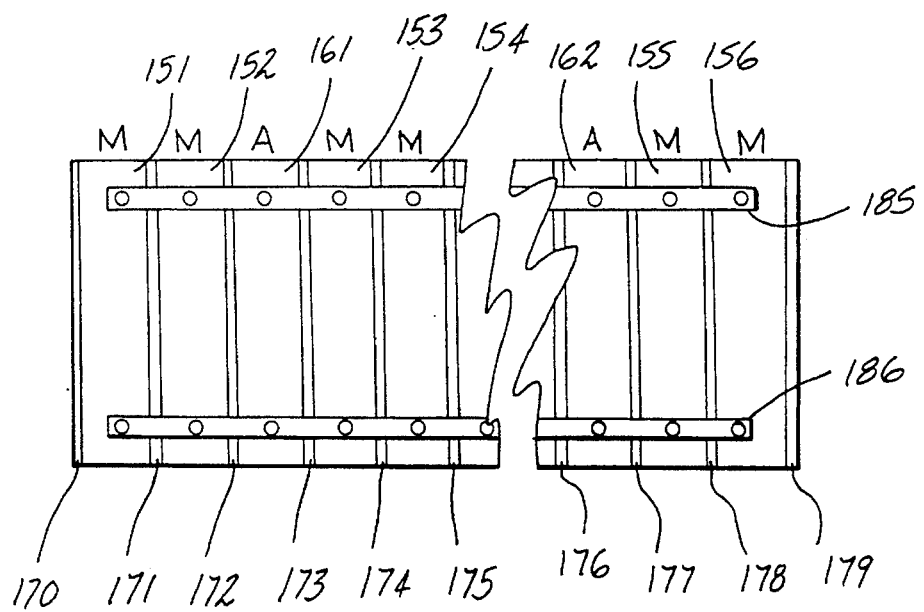
FIG. 2 is a breakaway a bottom view of a memory cube in accordance with the invention.

FIG. 2 is a breakaway bottom view of a memory cube in accordance with the invention showing a plurality of memory chips 151 through 156 and two auxiliary integrated circuit chips 161 and 162, each comprising multiple circuit elements. In the configuration illustrated in FIG. 2, an auxiliary circuit chip 161 is sandwiched between a pair of memory chips 152, 153. Adjacent chips are insulated from each other by passivation layers 170 through 179 and are bonded together along the passivation layers in a known fashion.

The memory and auxiliary circuit chips are shown to be interconnected by means of buses 185 and 186. These may for example be power buses. Connections from the power buses may be made to a substrate such as the substrate 100 in FIG. 1, by well known soldering techniques. Other interconnections (not shown in the drawing) may be made between the various memory and auxiliary circuit chips and the substrate or between chips within the cube, in a known fashion. An auxiliary circuit chip typically will contain circuitry such as power bus decoupling capacitors and line termination circuits for address, control and data lines for several memory chips, and will be interconnected with each of the associated memory chips that it serves. A memory cube may contain on the order of four or five or up to on the order of 40 memory chips. Typically one auxiliary circuit chip will be provided for every four or five memory chips. The number of auxiliary circuit chips needed is determined primarily by the number of leads terminating on the associated memory chips. This will include address leads and control leads as well as data write leads, each of which will be provided with a terminating network in the auxiliary circuit. Thus, the number of terminating circuits required is a function of the bandwidth of each of the memory chips, as well as the number of memory chips that it serves.

Figure 3:
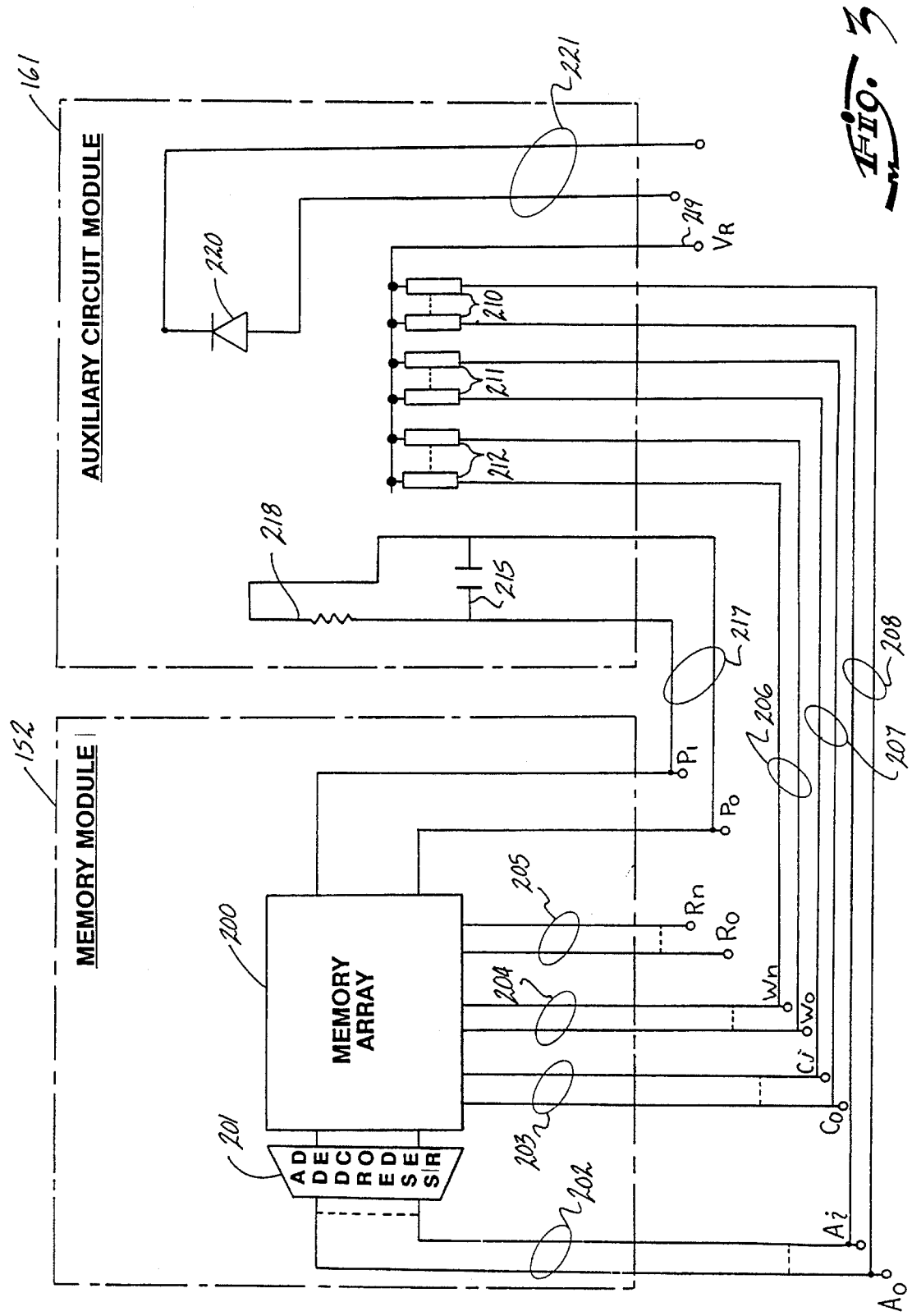
FIG. 3 is a schematic representation of an auxiliary integrated circuit chip in accordance with the invention electrically connected to a memory chip.

FIG. 3 is an electrical block diagram representation of a representative auxiliary circuit chip (e.g., chip 161 of FIG. 2) and a representative memory chip (e.g., chip 152 of FIG. 2). The memory chip 152 is represented in FIG. 3 as containing a memory array 200 and a address decoder 201 connected to the memory array. A number of address leads $A_0$ through $A_i$, designated in FIG. 3 at 202, provide a binary address to address decoder 201, which decodes the address and provides appropriate signals to the memory array 200. A number of control leads $C_0$ through $C_j$, designated at 203, provide control signals to the memory array, such as read and write control signals. A number of write data leads $W_0$ through $W_n$ designated at 204, provide data to be stored in the memory array 200. Thus each of the conductors indicated at 202, 203, and 204 are used to transmit signals to the memory chip 152. These leads are therefore transmission lines and reflections tend to occur on the transmission lines which will significantly distort data being transmitted unless the lines are properly terminated to eliminate reflections. Three sets of terminating networks 210, 211, and 212 are provided in the auxiliary circuit chip 161. One terminating network of the set 210 is connected to each of the address leads 202 via conductors 208. Similarly, one of the set of terminating networks 211 is connected to each of the control leads 203 via conductors 207 and one of the terminating networks 212 is connected to each of the data write leads 204 via conductors 206. The terminating networks may be simple resistor connected to a reference voltage such as voltage Vr on the conductor 219. Alternatively, the terminating network may consist of two opposing diodes connected in series and connected to the reference voltage to provide clamping. Other known terminating network configurations may be used as well.

Although FIG. 3 is a representation of one auxiliary circuit chip having a line terminating network corresponding to the address, control, and data leads terminating on a single memory chip, it will be apparent that the circuit chip can be arranged to provide line terminating networks for several memory chips.

In integrated circuit chips, including CMOS memory chips, a current spike flows through the power bus every time a gate changes state. The current spikes flowing through the resistance and inductance of the chip power bus and of the package interconnects develope power bus noise. Some of this noise can be avoided by proper integrated circuit design. However, at higher frequencies (e.g., in the 50 to 100 MHz range) occurring during data transfers, power bus noise is of such a magnitude that it becomes impractical to design a chip to avoid it. Decoupling capacitors connected to the power bus may be used to reduce the bus noise. The power bus is typically connected to a large number of chips and a decoupling capacitor is not needed for every chip. If discrete capacitors are used, they have to be removed a substantial distance from the memory chip, due to physical limitations of the memory cube configuration. Particularly at high frequencies, the connecting leads to the discrete capacitors add inductance and tend to introduce reflections and other extraneous noise signals.

In accordance with the present invention, a decoupling capacitor is incorporated in the auxiliary circuit chip and is connected across the power leads driving the memory chips. FIG. 3 shows a capacitor 215 connected across power leads 217 connected to the memory chip 152. The value of capacitance is dependent on the number of simultaneously switching devices and may typically be on the order of 30 nF to 100 nF. Placing the capacitor on the auxiliary circuit has the advantage that it is in close proximity to the memory chip which eliminates the interconnect inductance and hence the undesirable noise signals.

A concern in the construction of memory cubes and the like in which a number of integrated circuit silicon chips are individually encapsulated and bonded together by means of an adhesive is that the co-efficient of expansion of the insulating and adhesive material is different from that of the silicon. Changes in temperature, with the different rates of expansion of the silicon chip and the insulating and bonding materials, may cause the chips to crack. It is therefore desirable to maintain the entire cube structure at a relatively constant temperature. For this reason, a heating resistor 218 has been incorporated in the auxiliary circuit chip 161. The resistor 218 is connected across the power leads 217 and provides sufficient heating such that the temperature of the unit does not fall below a predetermined temperature.

A part of the reliability testing of any integrated circuit chip is a test to determine whether the device will work properly at elevated temperatures. A problem has been to determine the temperature internal to the memory cube during such a test. Temperature sensing diode 220 is incorporated in the auxiliary circuit chip 161 and may be connected to a current or voltage sensing device via leads 221 to provide a reading indicative of the temperature within the memory cube.

It will be understood that the above-described arrangement is merely illustrative of the application of the principles of the invention and that numerous other arrangements may be devised by those skilled in the art without departing from the spirit and scope of the invention. Particularly, principles of the invention apply equally to cubes or other structures constructed of logic circuit chips instead of, or in addition to, memory chips.

What we claim is:

1. An integrated circuit structure comprising:

a plurality of discrete integrated circuit chips each incorporating a plurality of active circuit devices and a plurality of input leads terminating on the discrete integrated circuit chips;

at least one auxiliary circuit chip comprising an integrated circuit chip incorporating a plurality of line termination circuits;

the discrete integrated circuit chips and the at least one auxiliary circuit chip each having substantially identical physical dimensions and each having two opposing end walls, and disposed adjacent one another and joined together along the end walls to form a substantially parallelepiped shaped structure of adjoining integrated circuit chips;

the discrete integrated circuit chips each comprising at least one side wall and terminals on the at least one side wall of at least one of the discrete integrated circuit chips connected to the active circuit devices in the at least one discrete integrated circuit chip;

the at least one auxiliary circuit chip comprising at least one side wall and terminals on the at least one side wall of the at least one auxiliary circuit chip connected to the line termination circuits; and interconnecting conductors connected between the terminals on the at least one side wall of the at least one auxiliary circuit chip and the terminals on the at least one side wall of the at least one of the discrete integrated circuit chips.

2. The integrated circuit structure in accordance with claim 1 wherein the active circuit devices comprise an integrated circuit memory having a plurality of data storage devices.

3. The structure in accordance with claim 1 and further comprising terminals on the at least one sidewall of plurality of the discrete integrated circuit chips and interconnecting conductors connected between the terminals on the at least one side wall of each of the plurality of discrete integrated circuit chips and terminals on the at least one side wall of the at least one auxiliary circuit chip.

4. The structure in accordance with claim 1 wherein the discrete integrated circuit chips each comprise a pair of power bus terminals connectable to a power bus for supplying electrical power to the discrete integrated circuit chips and wherein the at least one auxiliary circuit chip comprises a decoupling capacitor connected to the power bus terminals to reduce the magnitude of noise spikes occurring on the power bus terminals.

5. The structure in accordance with claim 1 wherein the at least one auxiliary circuit chip further comprises a heating resistor for maintaining the structure at a temperature higher than a predetermined minimum temperature.

6. The structure in accordance with claim 1 wherein the at least one auxiliary circuit chip further comprises a temperature sensing diode for sensing temperature internal to the structure.

7. The structure in accordance with claim 1 and further comprising a printed circuit substrate and wherein the at least one side wall of each of the discrete integrated circuit chips and of the at least one auxiliary circuit chip are aligned to form one side of the parallelepiped shaped structure and wherein the structure is mounted on the printed circuit substrate with the one side of the parallelepipe shaped structure disposed immediately adjacent one side of the printed circuit substrate.

8. The memory in accordance with claim 1 and comprising at least one additional auxiliary circuit chip and wherein the at least one and the at least one additional auxiliary circuit chips are disposed among the discrete integrated circuit chips on an interleaved basis.

9. The structure in accordance with claim 8 wherein at least one of the at least one and the at least one additional auxiliary circuit chips has terminals connected to terminals of a plurality of the discrete integrated circuit chips.

10. The structure in accordance with claim 2 wherein the terminals on the at least one wall of the at least one discrete integrated circuit chip comprise memory address terminals.

11. The structure in accordance with claim 2 wherein the terminals on the at least one wall of the at least one discrete integrated chip comprise memory read/write control terminals.

12. The structure in accordance with claim 2 wherein the terminals on the at least one wall of the at least one discrete integrated circuit chip comprise memory data write terminals.

13. A high density integrated circuit memory module comprising:

a support substrate; and a plurality of integrated circuit modules of substantially identical physical dimensions and each of the I.C.

modules having two opposing end walls, the integrated circuit modules being joined together at their respective end walls to form a parallelepiped shaped integrated memory stack mounted on the substrate;

the plurality of integrated circuit modules comprsing a plurality of memory modules and at least one auxiliary module;

the memory modules each comprising a memory array and the at least one auxiliary module comprising a plurality of line terminating networks;

each of the memory modules comprising a side wall and a plurality of electrical terminals disposed on the side wall of each memory module and connected to signal leads transmitting signals to the memory array internal to each memory module;

the at least one auxiliary module comprising a side wall and a plurality of electrical terminals on the side wall of the at least one auxiliary module, each of the electrical terminals on the side wall of the least one auxiliary module connected to a selected one of the line terminating networks; and a plurality of interconnecting conductors extending between the at least one auxiliary module and at least one of the memory modules and interconnecting the signal leads of the at least one of the memory modules with line terminating networks in the at least one auxiliary module.

14. The integrated circuit memory module in accordance with claim 13 and wherein the interconnecting conductors extend between the at least one auxiliary module and a plurality of the memory modules and the interconnecting conductors interconnect the signal leads of a plurality of the memory modules with the termination circuits in the at least one auxiliary module.

15. An integrated circuit memory module comprising:

a support substrate;

a plurality of integrated circuit modules of substantially identical physical dimensions and each of the integrated circuit modules having two opposing end walls, the integrated circuit modules being joined together at their respective end walls to form a parallelepiped shaped integrated memory stack mounted on the substrate;

the plurality of integrated circuit modules comprising a plurality of memory modules and at least one auxiliary module disposed between a pair of memory modules;

the memory modules each comprising a memory array and the at least one auxiliary module comprising a plurality of line terminating networks;

each of the memory modules comprising a side wall and a plurality of address leads disposed on the side wall of each memory module and each memory module transmitting address signals to the memory array internal to each memory module; and a plurality of interconnecting conductors connecting address leads of at least one of the memory modules to the line termination networks in the at least one auxiliary module.

* * * * *